United States Patent
Imaizumi et al.

(10) Patent No.: US 11,329,462 B2
(45) Date of Patent: May 10, 2022

(54) ENGAGEMENT STRUCTURE OF COVER AND BLOCK MEMBER, ELECTRONIC COMPONENT MODULE, ELECTRICAL CONNECTION BOX, AND WIRE HARNESS

(71) Applicants: YAZAKI CORPORATION, Tokyo (JP); HONDA MOTOR CO., LTD., Tokyo (JP)

(72) Inventors: Yoshihito Imaizumi, Makinohara (JP); Jun Sato, Makinohara (JP); Seiju Kawamata, Wako (JP); Toshibumi Shiohata, Wako (JP)

(73) Assignees: YAZAKI CORPORATION, Tokyo (JP); HONDA MOTOR CO., LTD., Tokyo (JP)

( * ) Notice: Subject to any disclaimer, the term of this patent is extended or adjusted under 35 U.S.C. 154(b) by 441 days.

(21) Appl. No.: 16/600,413

(22) Filed: Oct. 11, 2019

(65) Prior Publication Data
US 2020/0119532 A1    Apr. 16, 2020

(30) Foreign Application Priority Data

Oct. 16, 2018 (JP) .............................. JP2018-194887

(51) Int. Cl.
*H02G 3/08*    (2006.01)
*H01R 12/58*   (2011.01)
(Continued)

(52) U.S. Cl.
CPC ......... *H02G 3/081* (2013.01); *B60R 16/0239* (2013.01); *H01R 12/58* (2013.01);
(Continued)

(58) Field of Classification Search
CPC ............ H02G 3/08; H02G 3/081; H02G 3/14; H05K 5/00; H05K 5/0073; H05K 5/02;
(Continued)

(56) References Cited

U.S. PATENT DOCUMENTS 7,364,449 B2 * 4/2008 Makino ................. H01R 9/226
439/721
7,510,407 B1 * 3/2009 Blasko ................. H01R 12/712
439/79
(Continued)

FOREIGN PATENT DOCUMENTS

| CN | 106067665 A | 11/2016 |
| CN | 106356780 A | 1/2017 |
| JP | 2017-103916 A | 6/2017 |

*Primary Examiner* — Angel R Estrada
(74) *Attorney, Agent, or Firm* — Kenealy Vaidya LLP

(57) ABSTRACT

An engagement structure includes a cover having an opening portion, a block member inserted into the opening portion, an engagement mechanism configured to engage the block member with the opening portion, and an engagement stabilization mechanism configured to stabilize an engagement state of the engagement mechanism. The engagement stabilization mechanism includes a first stabilization mechanism and a second stabilization mechanism. The first stabilization mechanism permits excessive insertion due to backlash that occurs in the engagement mechanism and to restore the excessive insertion after the block member is engaged with the opening portion. The second stabilization mechanism performs a slide engagement between the block member and the opening portion and to restrict a wall inner surface of the cover from moving away from an outer surface of a side portion of the block member after the slide engagement is completed.

12 Claims, 16 Drawing Sheets

(51) Int. Cl.
*H05K 5/00* (2006.01)
*B60R 16/023* (2006.01)
*H05K 5/03* (2006.01)
*H05K 7/02* (2006.01)
*H02G 3/14* (2006.01)
*H05K 5/02* (2006.01)

(52) U.S. Cl.
CPC .............. *H02G 3/14* (2013.01); *H05K 5/0073* (2013.01); *H05K 5/0217* (2013.01); *H05K 5/03* (2013.01); *H05K 7/02* (2013.01)

(58) Field of Classification Search
CPC .......... H05K 7/02; H05K 7/00; H05K 5/0217; H01R 12/58; H01R 12/00; B60R 16/0239; B60R 16/00; B60R 16/02; B60R 16/0238
USPC ................. 174/50, 520, 559, 560, 561, 562; 220/3.2, 3.3, 4.02; 361/600, 601, 615, 361/616, 622, 627, 641; 439/76.1, 76.2
See application file for complete search history.

(56) References Cited

U.S. PATENT DOCUMENTS

| | | | |
|---|---|---|---|
| 7,514,629 B2* | 4/2009 | Sasaki | ................... H02G 3/086 361/752 |
| 7,714,237 B2* | 5/2010 | Fabrizi | ................... H02G 3/18 361/829 |
| 2016/0315458 A1 | 10/2016 | Kamo | |
| 2017/0164496 A1 | 6/2017 | Imaizumi | |

* cited by examiner

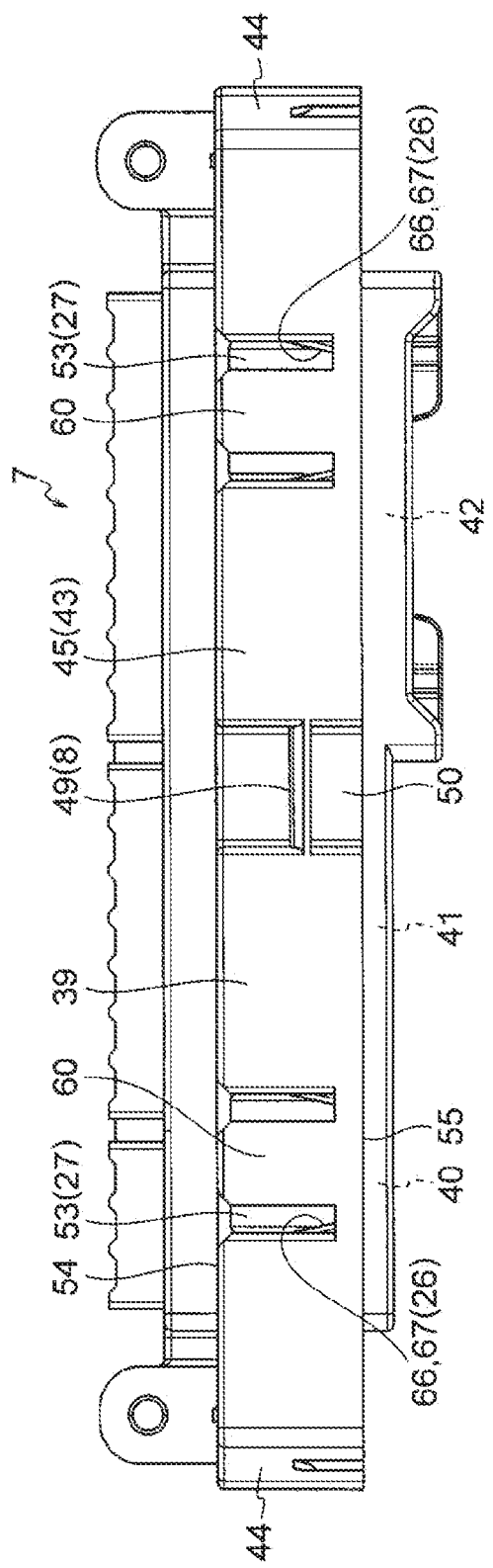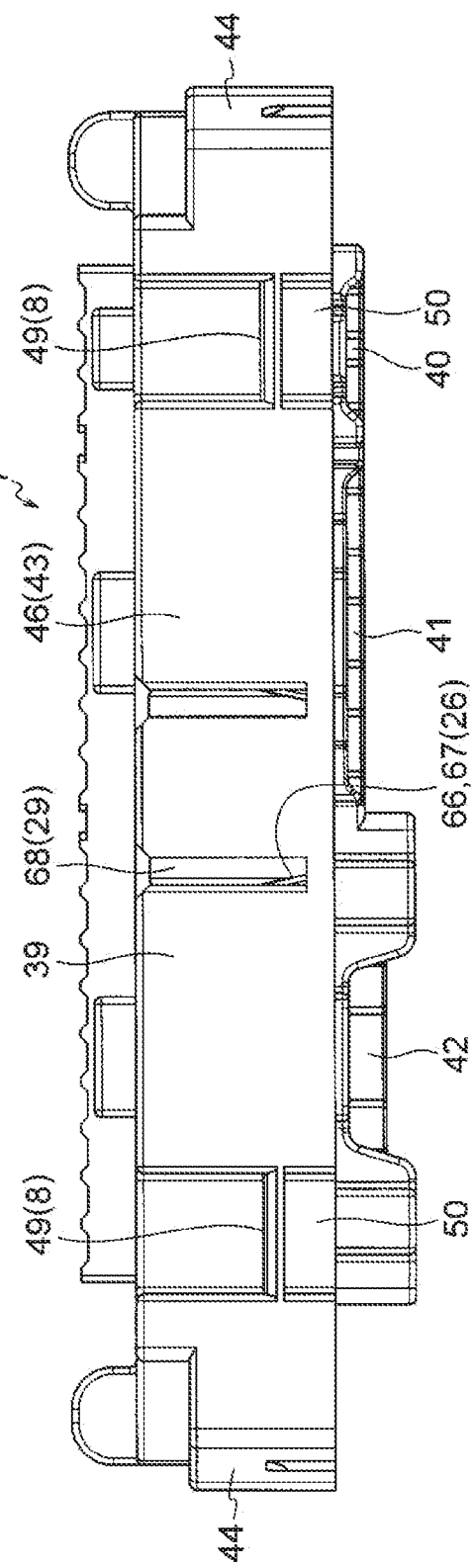

ENGAGEMENT STRUCTURE OF COVER AND BLOCK MEMBER, ELECTRONIC COMPONENT MODULE, ELECTRICAL CONNECTION BOX, AND WIRE HARNESS

CROSS REFERENCE TO RELATED APPLICATIONS

This application is based on Japanese Patent Application (No. 2018-194887) filed on Oct. 16, 2018, the contents of which are incorporated herein by reference.

BACKGROUND OF THE INVENTION

1. Field of the Invention

The present invention relates to an engagement structure of a bottomed cylindrical cover which includes a substantially rectangular opening portion and a block member which is inserted into the opening portion of the cover. In particular, the present invention relates to the engagement structure of the cover and the block member, which further includes an engagement stabilization mechanism configured to stabilize an engagement state. The present invention also relates to an electronic component module in which the engagement structure is used, an electrical connection box including the electronic component module, and a wire harness.

2. Description of the Related Art

Techniques for an electronic component module and an electrical connection box are disclosed, for example, in JP-A-2017-103916. The electronic component module includes a cover, a substrate which is housed inside the cover from the outside, and a connector block (block member) which is engaged with an opening portion of the cover. The electrical connection box includes the electronic component module and a frame which is configured to house and lock the electronic component module inside the frame. The electrical connection box is mounted on a vehicle. Examples of the electronic component module include a relay module and the like.

The cover and the connector block are engaged by an engagement mechanism formed across the cover and the connector block. The engagement mechanism is disposed and formed so as to be aligned with a long side part of the opening portion of the cover. The connector block is formed with a protrusion (a portion denoted by a reference numeral 55 in JP-A-2017-103916 for stabilizing a state in which the cover and the connector block are engaged by the engagement mechanism. The protrusion is disposed and formed on a short side part of the connector block so as to restrict the long side part of the cover from moving away from an outer surface of the connector block (the long side part of the cover is bent in a direction in which the long side part of the cover is in close contact with the outer surface of the connector block by an action of the protrusion).

In a related art described above, when rattling occurs due to vibration, the protrusion may be worn out. If abrasion occurs, the state of engagement by the engagement mechanism becomes unstable. Therefore, in some cases, there is a problem that the connector block or a substrate may be detached from a case. Therefore, the inventors of the present application considered that a new mechanism which is not a protrusion, that is, a new mechanism which is configured to stabilize the engagement state, needs to be provided together with the engagement mechanism.

SUMMARY OF THE INVENTION

The present invention has been made in view of the above circumstances, and an aspect of the present invention is to provide an engagement structure of a cover and a block member, which can stabilize an engagement state by an engagement mechanism. Another aspect of the present invention is to provide an electronic component module, an electrical connection box, and a wire harness, which use the engagement structure.

The above-described object of the present disclosure is achieved by below-described structures.

(1) An engagement structure of a cover and a block member, the engagement structure including:

a cover having a bottomed cylindrical shape and which includes a substantially rectangular opening portion;

a block member configured to be inserted into the opening portion of the cover;

an engagement mechanism configured to engage the block member with the opening portion; and an engagement stabilization mechanism configured to stabilize an engagement state of the engagement mechanism, in which the engagement stabilization mechanism includes a first stabilization mechanism and a second stabilization mechanism, in which the first stabilization mechanism is configured to permit excessive insertion due to backlash that occurs in the engagement mechanism when the block member is inserted into the opening portion and to restore the excessive insertion after the block member is engaged with the opening portion by the engagement mechanism, and in which the second stabilization mechanism is configured to perform a slide engagement between the block member and the opening portion when the block member is inserted into the opening portion and to restrict a wall inner surface of the cover from moving away from an outer surface of a side portion of the block member after the slide engagement is completed.

According to the above configuration of the item (1), the first stabilization mechanism and the second stabilization mechanism are provided together with the engagement mechanism which is configured to engage the cover with the block member. Therefore, it is possible to prevent backlash in the engagement mechanism and restrict opening between the wall inner surface of the cover and the outer surface of the side portion of the block member to prevent the engagement mechanism from being disengaged by the first stabilization mechanism and the second stabilization mechanism. That is, the engagement state by the engagement mechanism can be stabilized.

(2) For example, the second stabilization mechanism includes:

a concave portion provided on one of the outer surface of the side portion of the block member and the wall inner surface of the cover, and a convex portion provided on the other of the outer surface of the side portion of the block member and the wall inner surface of the cover, a T-shaped rib having a substantial T shape in cross section and a convex portion insertion opening which is an insertion part for the convex portion are formed in the concave portion, the T-shaped rib having a first longitudinal rib protruding toward a concave opening from substantially a center of a concave bottom surface of the concave portion and a first lateral rib being continuous with the first longitudinal rib at the concave opening, the convex portion has a pair of L-shaped ribs which have a substantial L shape in cross section and include a pair of second longitudinal ribs and a pair of second lateral ribs, and the pair of second longitudinal ribs are inserted into the concave portion via the convex portion insertion opening at both end positions of the first lateral rib in the concave opening and the pair of second lateral ribs are respectively continuous with the pair of second longitudinal ribs so as to be inserted between the concave bottom surface and the first lateral rib.

According to the above configuration of the item (2), the second stabilizing mechanism is configured by the concave portion including the T-shaped rib and the convex portion including the pair of L-shaped ribs. Therefore, one of a better configuration and a better structure can be provided.

(3) For example, a pair of first backlash preventing ribs are provided on the concave portion and act in a direction in which the outer surface of the side portion of the block member and the wall inner surface of the cover move closer to each other, and the pair of first backlash preventing ribs are disposed at a position where the pair of second lateral ribs in the convex portion are in contact with the pair of first backlash preventing ribs.

According to the above configuration of the item (3), the first backlash preventing rib is formed in the concave portion including the T-shaped rib and is brought into contact with the pair of L-shaped ribs of the convex portion. Therefore, backlash between the concave portion and the convex portion can be prevented, thereby opening between the wall inner surface of the cover and the outer surface of the side portion of the block member can be restricted.

(4) For example, a pair of second backlash preventing ribs are provided on a concave side surface of the concave portion, and the pair of second backlash preventing ribs are formed in a shape that restricts the pair of L-shaped ribs, which are the convex portion, from being deformed in a separation direction.

According to the above configuration of the item (4), the pair of second backlash preventing rib is formed in the concave portion including the T-shaped rib and is brought into contact with the pair of L-shaped ribs of the convex portion. Therefore, backlash between the concave portion and the convex portion can be prevented, thereby opening between the wall inner surface of the cover and the outer surface of the side portion of the block member can be restricted.

(5) For example, the pair of second backlash preventing ribs serve as the first stabilization mechanism.

According to the above configuration of the item (5), the pair of second backlash preventing ribs has a function as the first stabilization mechanism. Therefore, it is possible to prevent backlash in the engagement mechanism at the same place as the opening restriction. According to the present invention, it is possible to integrate the first stabilization mechanism and the second stabilization mechanism.

(6) For example, the second stabilization mechanism is disposed at both sides of the engagement mechanism and/or disposed between the engagement mechanism and other engagement mechanism.

According to the above configuration of the item (6), one of the better disposing of the second stabilization mechanism for the engagement mechanism can be provided.

(7) For example, the first stabilization mechanism includes a cover side inclined surface formed on an edge inner surface of the opening and a block side inclined surface of the block member formed in a shape on which the cover side inclined surface slides.

According to the above configuration of the item (7), one of a better configuration and a better structure of the first stabilization mechanism can be provided.

(8) According to the present invention, there is also provided an electronic component module, including:

a substrate on which a plurality of electronic components are mounted;

a cover having a bottomed cylindrical shape and has an opening portion;

a block member configured to be inserted into the opening portion of the cover in a state that the substrate is held by the block member;

an engagement mechanism configured to engage the block member with the opening portion; and an engagement stabilization mechanism configured to stabilize an engagement state of the engagement mechanism, in which the engagement structure according to any one of the above items (1) to (7) is provided on the cover and the block member.

According to the above configuration of the item (8), the engagement state of the cover and the block member is stabilized, so that a better electronic component module can be provided.

(9) According to the present invention, there is also provided an electrical connection box, including:

the electronic component module according to the above item (8);

a frame to which the electronic component module is configured to be assembled; and a lid member configured to cover a frame opening portion of the frame.

According to the above configuration of the item (9), the electronic component module having the effects described above is provided, so that a better electrical connection box can be provided.

(10) According to the present invention, there is also provided a wire harness, including:

a wire harness body; and the electric connection box according to the above item (9) provided at an end portion of the wire harness body, in which the wire harness body is wired in an automobile.

According to the above configuration of the item (10), the electronic component module and the electrical connection box having the effects described above are provided, so that a better wire harness can be provided.

(11) According to the present invention, there is also provided a wire harness, including:

a wire harness body; and the electronic component module according to the above item (8) provided at an end portion of the wire harness body, in which the wire harness body is wired in an automobile.

According to the above configuration of the item (11), the electronic component module having the effects described above is provided, so that a better wire harness can be provided.

(12) For example, a cover of the electronic component module is formed with a bracket attaching and detaching portion which is attachable to and detachable from a bracket provided in the automobile.

According to the above configuration of the item (12), attachment of the electronic component module to an automobile can be facilitated.

According to the engagement structure of a cover and a block member in the present invention, the first stabilization mechanism and the second stabilization mechanism are provided together with the engagement mechanism. Therefore, the engagement state by the engagement mechanism can be stabilized. Further, according to the present invention, it is possible to provide better electronic component module, electrical connection box, and wire harness by using the structure having the above effects, that is, the engagement structure of the cover and the block member.

BRIEF DESCRIPTION OF DRAWINGS

FIGS. 6A and 6B illustrate a cover, in which FIG. 6A is an enlarged perspective view of an opening portion side in FIG. 3, and FIG. 6B is viewed from an arrow C direction in FIG. 6A.

FIGS. 7A and 7B illustrate a cover side lock portion, in which FIG. 7A is an enlarged view of a circle D in FIG. 6, and FIG. 7B is a perspective view of FIG. 7A.

FIGS. 8A and 8B illustrate a convex portion of a second stabilization mechanism, in which FIG. 8A is an enlarged view of a circle E in FIG. 6, and FIG. 8B is a cross-sectional view taken along a line F-F in FIG. 8A.

FIGS. 9A and 9B illustrate a connector block, in which FIG. 9A is an enlarged perspective view of FIG. 3, and FIG. 9B is viewed from an arrow G direction in FIG. 9A.

FIGS. 10A and 10B illustrate the connector block, in which FIG. 10A is viewed from an arrow H direction in FIG. 9A, and FIG. 10B is viewed from an arrow I direction in FIG. 9A.

FIGS. 11A and 11B illustrate the connector block, in which FIG. 11A is a perspective view of the connector block as viewed from an arrow J direction in FIG. 9A, and FIG. 11B is viewed from an arrow M direction in FIG. 11A.

FIGS. 12A and 12B illustrate a block side lock portion, in which FIG. 12A is an enlarged view of a circle K in FIG. 9A, and FIG. 12B is an enlarged view of a circle L in FIG. 9B.

FIGS. 13A and 13B illustrate a second stabilization mechanism and a first stabilization mechanism, in which FIG. 13A is an enlarged view of a circle N in FIG. 11B, and FIG. 13B is a cross-sectional view.

FIGS. 16A, 169, 16C, and 16D illustrate a modification of the first stabilization mechanism, in which FIG. 16A illustrates excessive insertion due to backlash that occurs in the engagement mechanism, FIG. 16C illustrates a backlash condition, and FIG. 16D is a cross-sectional view taken along a line W-W in FIG. 16C.

DESCRIPTION OF EMBODIMENTS

An electronic component module includes a substrate on which a plurality of electronic components are mounted, a bottomed cylindrical cover including an opening portion, a connector block (a block member) which is inserted into the opening portion of the cover so as to hold the substrate, an engagement mechanism which is configured to engage the connector block with the opening portion, and an engagement stabilization mechanism which is configured to stabilize an engagement state of the engagement mechanism. A first stabilization mechanism in the engagement stabilization mechanism is configured to permit excessive insertion due to a backlash that occurs in the engagement mechanism when the connector block is inserted into the opening portion and to restore the excessive insertion after an engagement of the engagement mechanism. A second stabilization mechanism in the engagement stabilization mechanism is configured to perform a slide engagement when the connector block is inserted into the opening portion and to restrict a wall inner surface of the cover from moving away from a side portion outer surface of the connector block after the slide engagement.

First Embodiment

Figure 1:
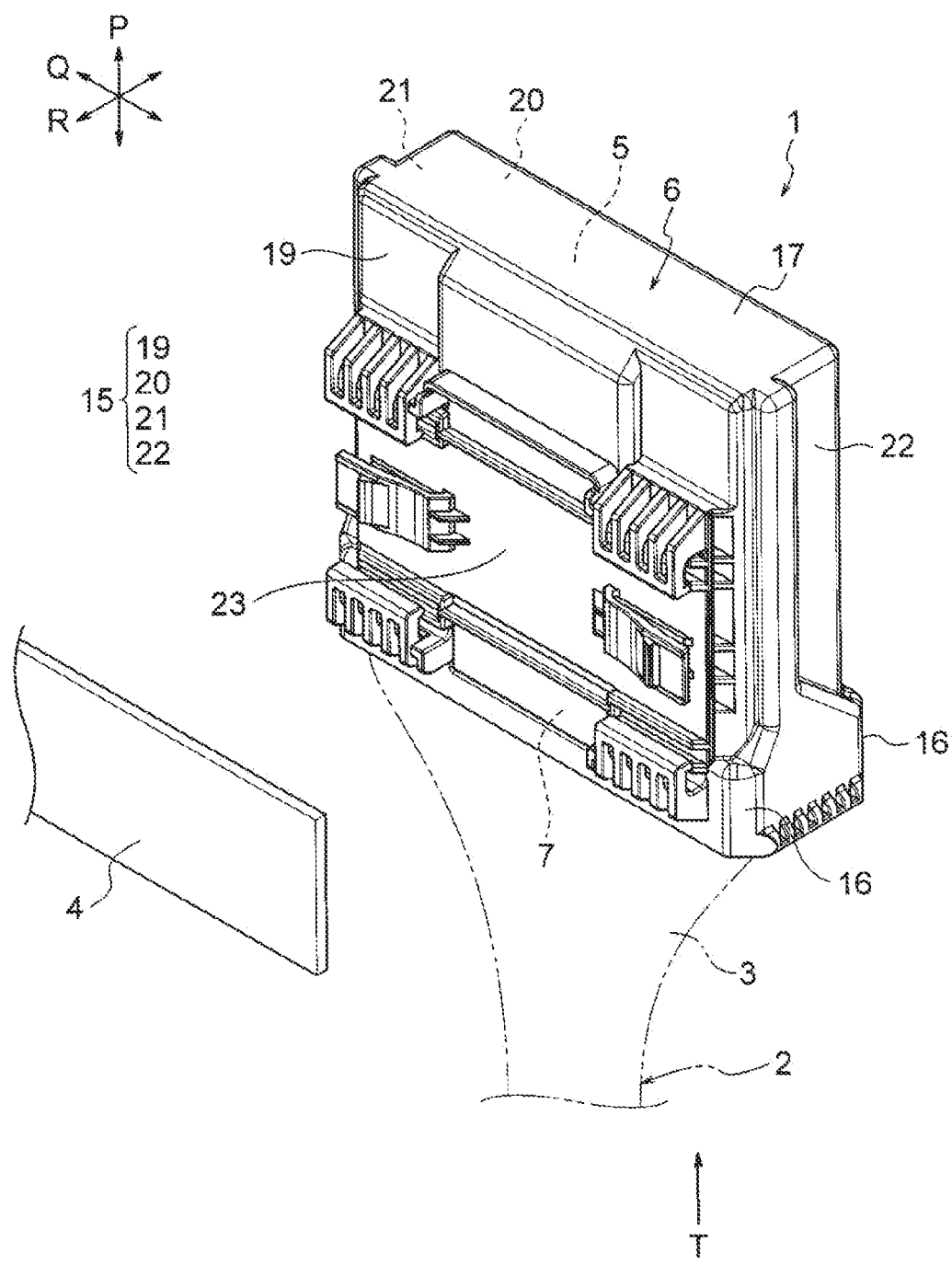
FIG. 1 is a perspective view illustrating an electronic component module according to an embodiment of the present invention (first embodiment).
Figure 2:
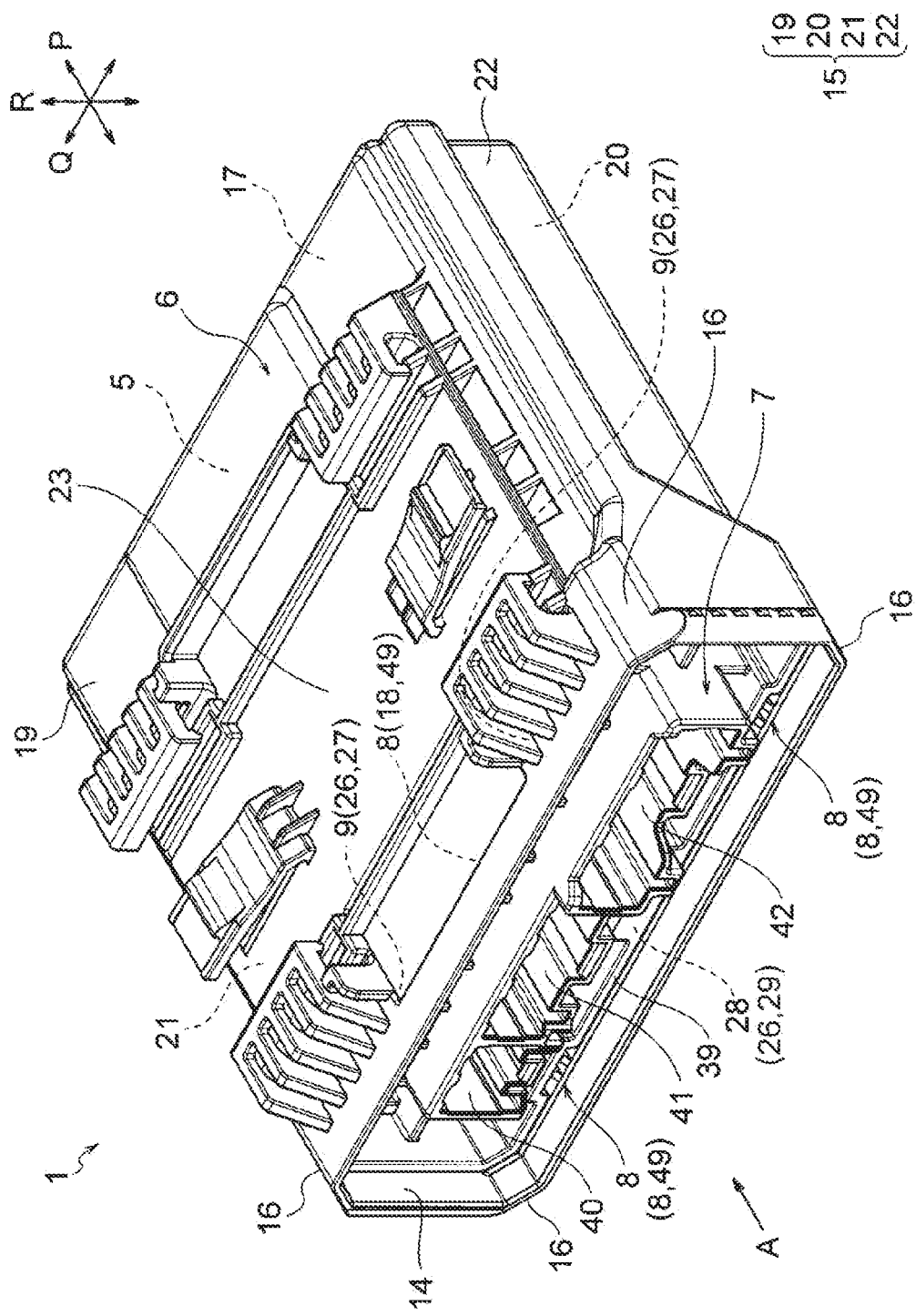
FIG. 2 is a perspective view of the electronic component module in FIG. 1 as viewed from an arrow T direction.
Figure 3:
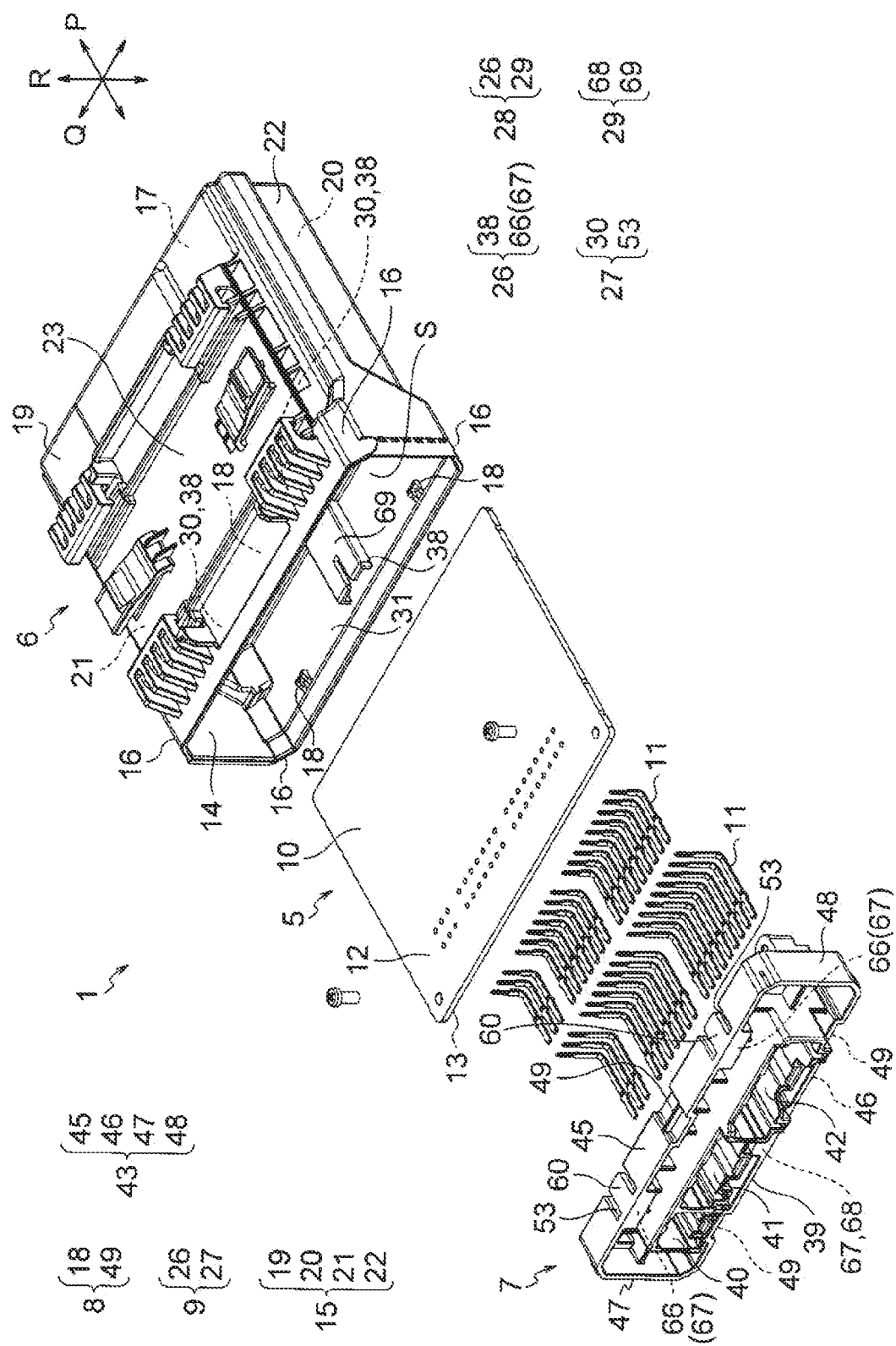
FIG. 3 is an exploded perspective view illustrating a configuration of the electronic component module.
Figure 4:
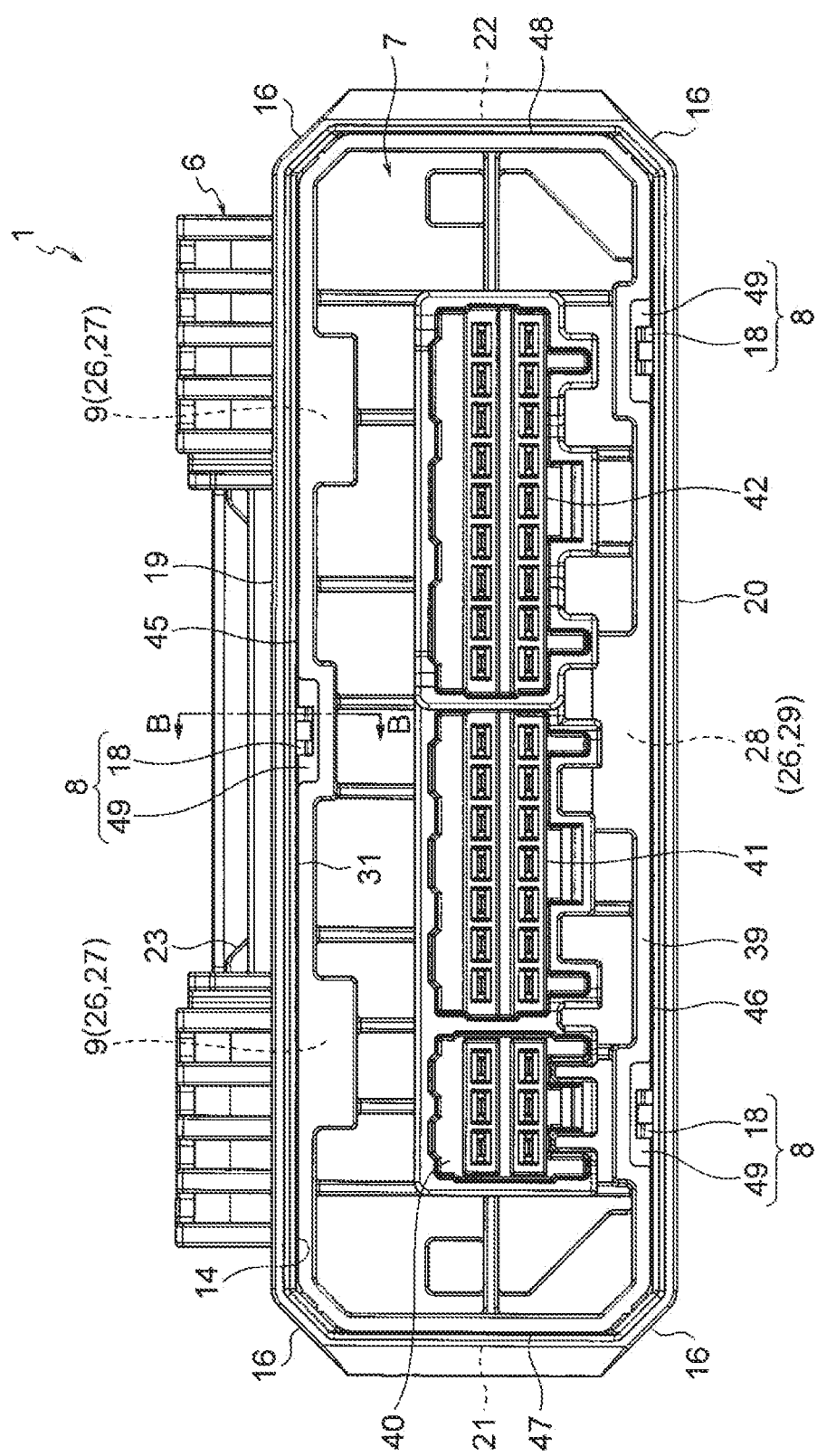
FIG. 4 is a view of the electronic component module in FIG. 2 as viewed from an arrow A direction.
Figure 5:
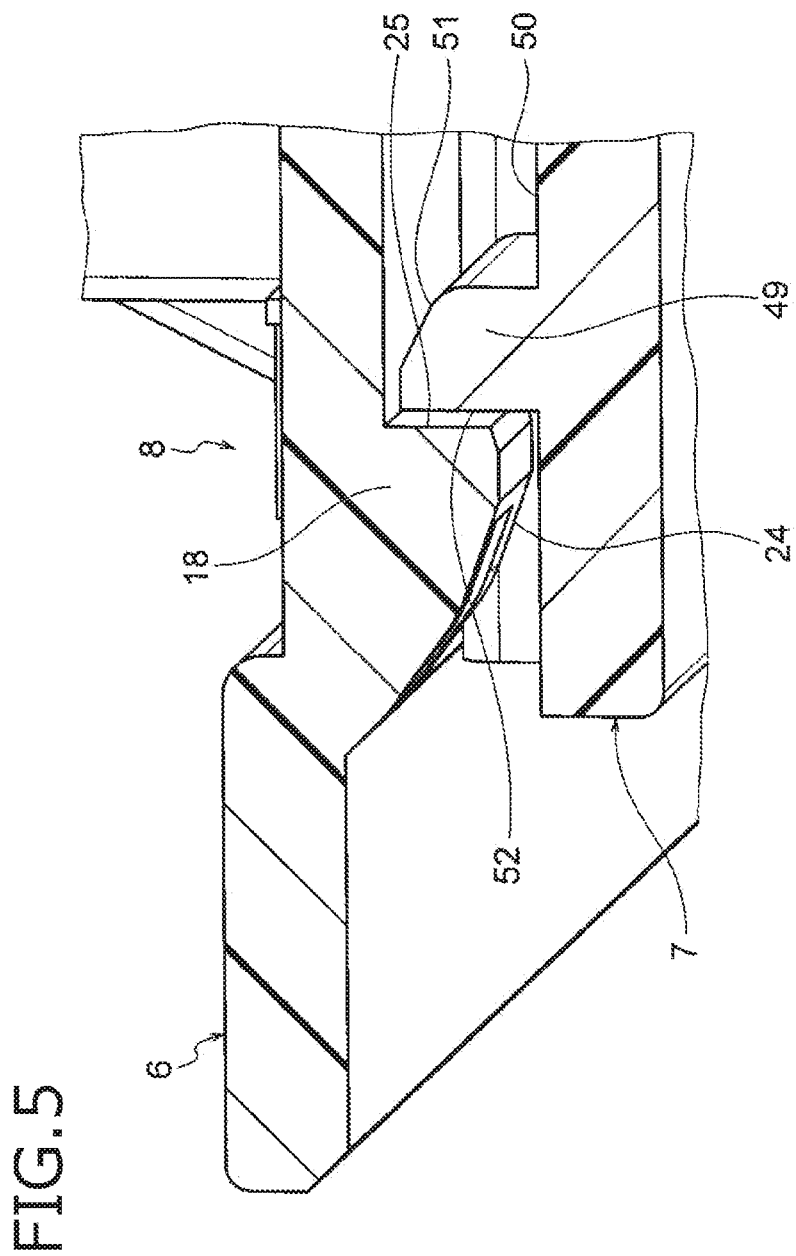
FIG. 5 is a cross-sectional view illustrating an engagement mechanism at a position of a line B-B in FIG. 4.
Figure 6A:
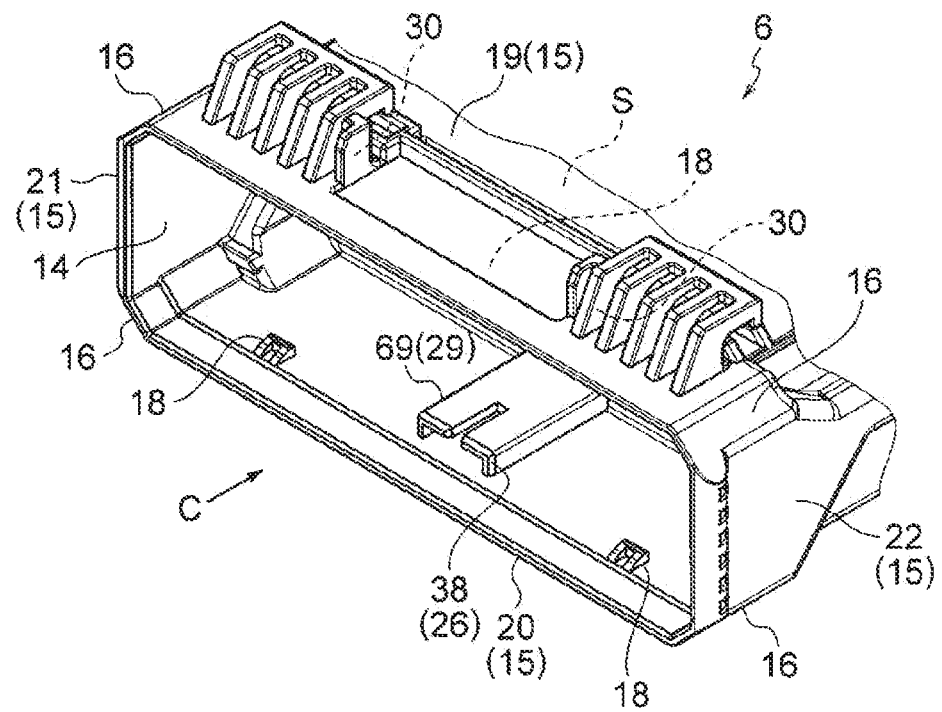
Figure 6B:
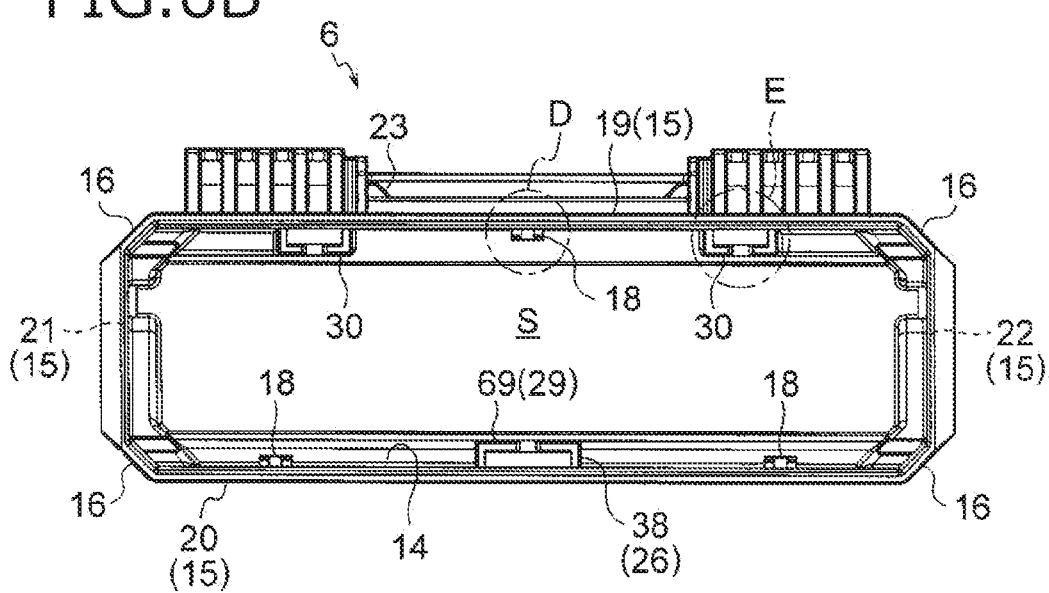
Figure 7A:
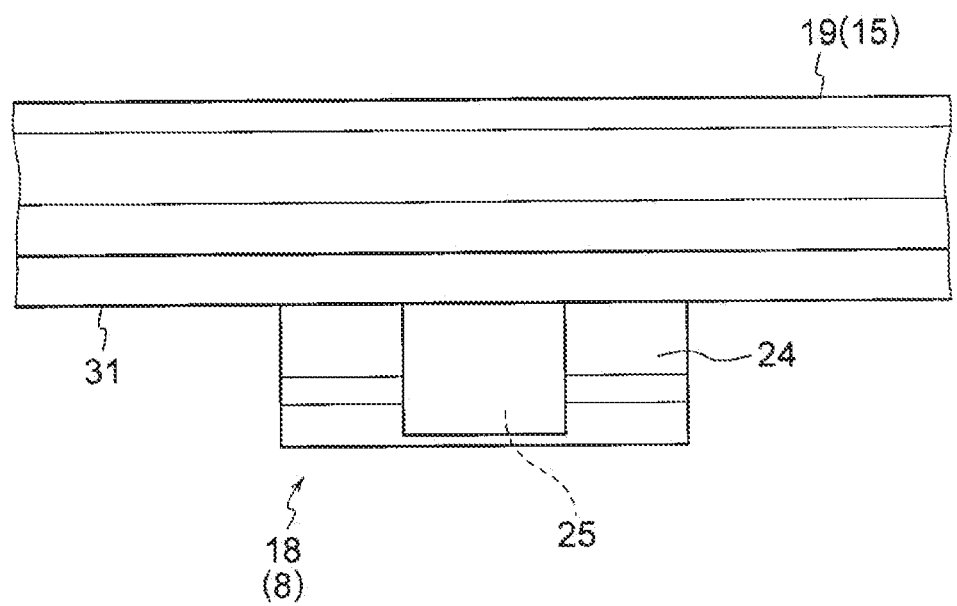
Figure 7B:
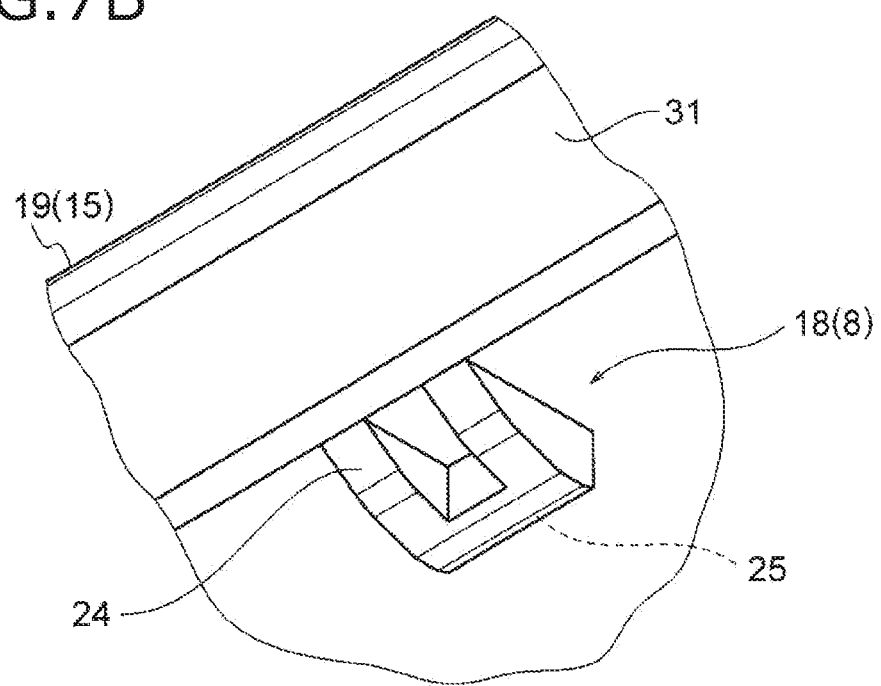
Figure 8A:
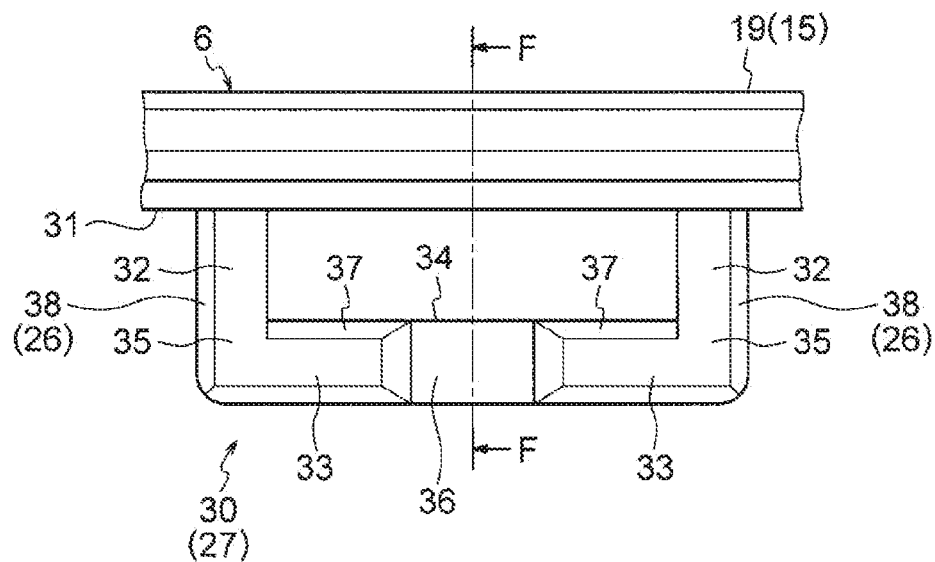
Figure 8B:
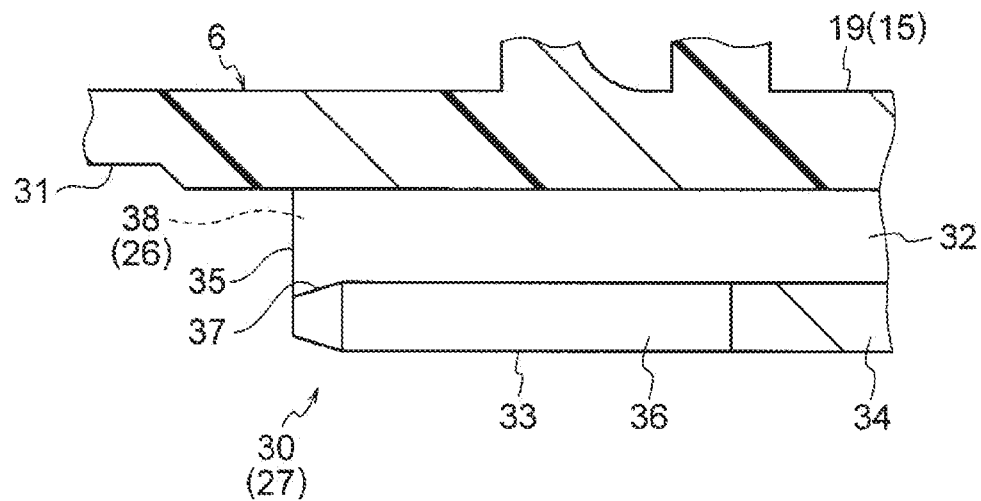
Figure 12A:
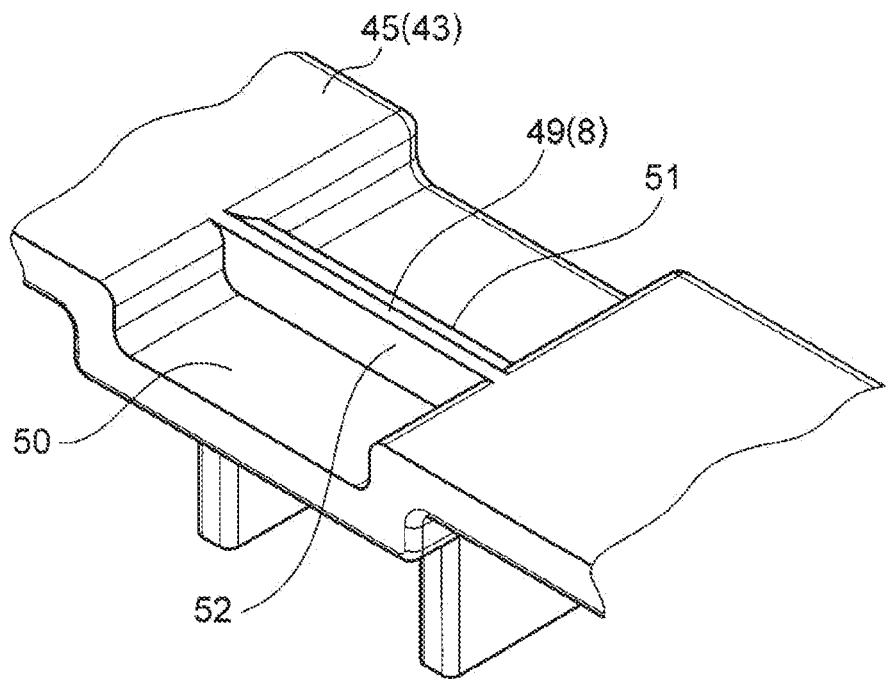
Figure 12B:
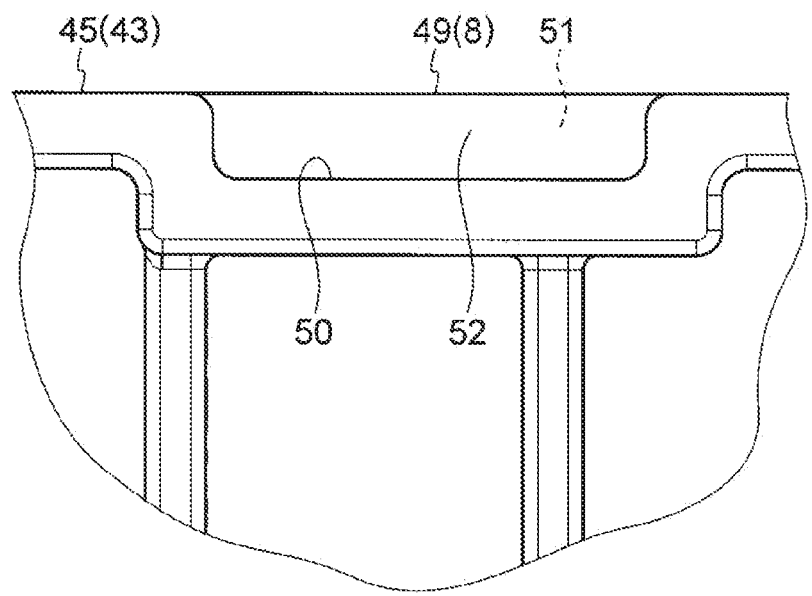
Figure 13A:
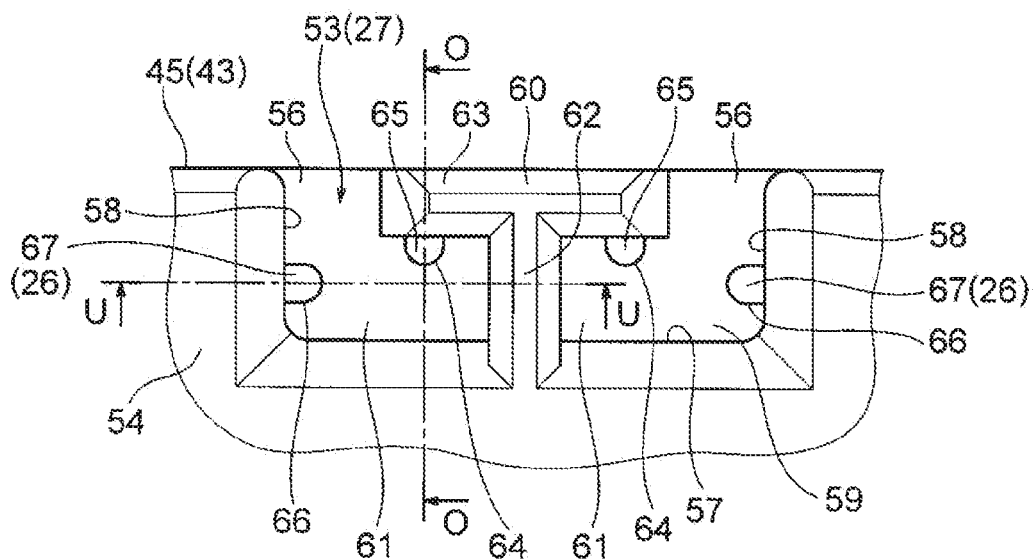
Figure 13B:
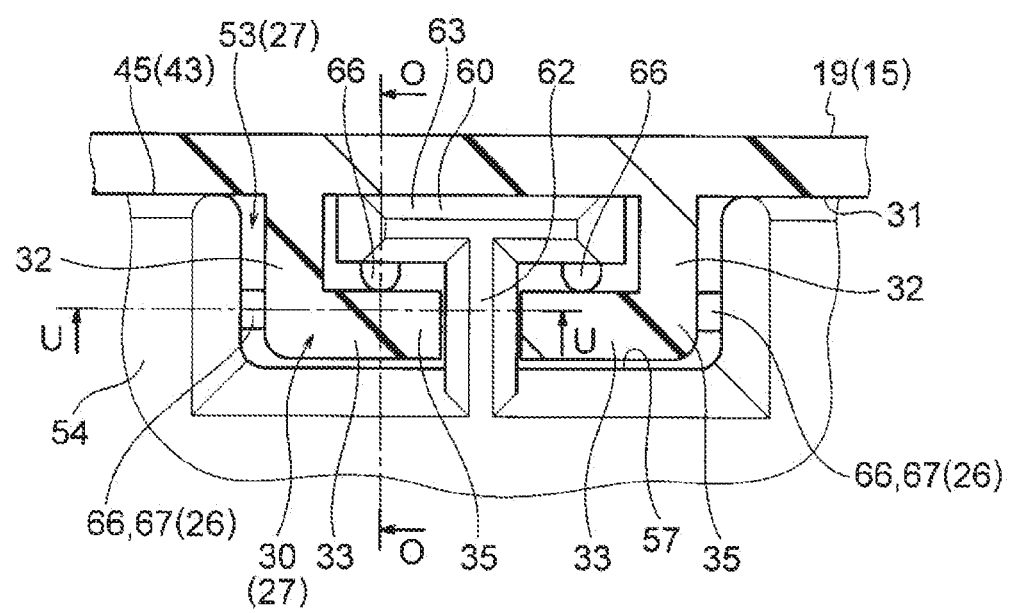
Figure 14A:
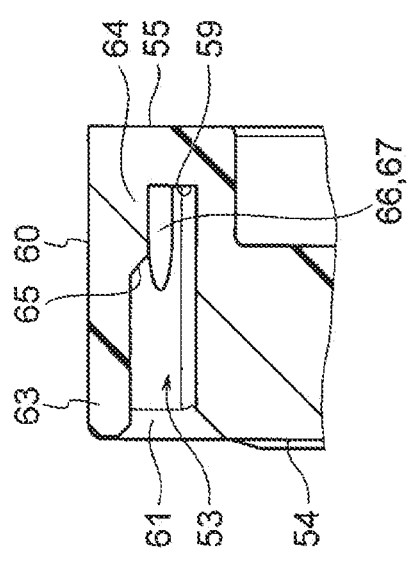
FIGS. 14A and 14B are cross-sectional views taken along lines O-O in FIGS. 13A and 13B.
Figure 14B:
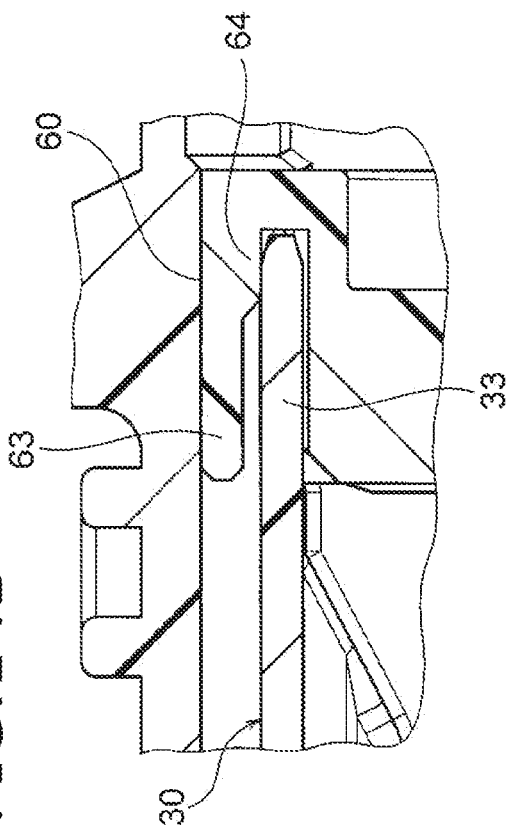
Figure 15A:
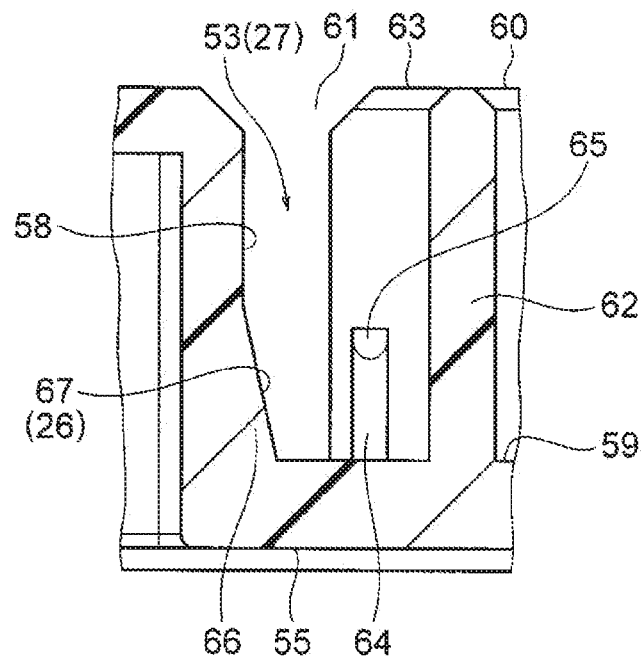
FIGS. 15A and 15B are cross-sectional views taken along lines U-U in FIGS. 13A and 13B.
Figure 15B:
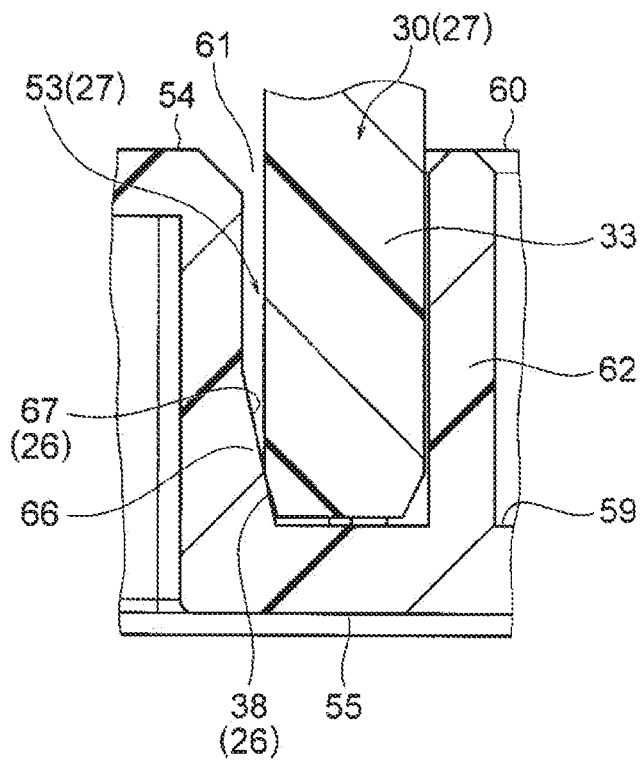

A first embodiment will be described below with reference to the drawings. FIG. 1 is a perspective view illustrating an electronic component module according to an embodiment of the present invention. FIG. 2 is a perspective view of the electronic component module in FIG. 1 as viewed from an arrow T direction. FIG. 3 is an exploded perspective view illustrating a configuration of the electronic component module. FIG. 4 is a view of the electronic component module in FIG. 2 as viewed from an arrow A direction. FIG. 5 is a cross-sectional view illustrating an engagement mechanism at a position of a line B-B in FIG. 4. FIGS. 6A and 6B illustrate a cover. FIGS. 7A and 7B illustrate a cover side lock portion. FIGS. 8A and 8B illustrate a convex portion of a second stabilization mechanism. FIGS. 9A to 11B illustrate a connector block. FIGS. 12A and 12B illustrate a block side lock portion. FIGS. 13A and 13B illustrate a second stabilization mechanism and a first stabilization mechanism. FIGS. 14A and 14B are cross-sectional views taken along lines O-O in FIGS. 13A and 13B. FIGS. 15A and 15B are cross-sectional views taken along lines U-U in FIGS. 13A and 13B.

In FIGS. 1 to 3, an arrow P indicates an upper-lower direction, an arrow Q indicates a left-right direction, and an arrow R indicates a front-rear direction (orientation is an example).

<Electronic Component Module 1>

In FIG. 1, the electronic component module 1 is disposed at a predetermined end 3 of a wire harness 2 wired in an automobile. In other words, the electronic component module 1 is connector-connected to a plurality of connectors (not illustrated) provided on the end 3 and is mounted at a predetermined position of an automobile in this connection state. An example of a mounting destination of the electronic component module 1 is a bracket 4 provided in an automobile. The electronic component module 1 is formed so as to be detachably attached to the bracket 4.

The electronic component module 1 may be mounted as follows. That is, an electrical connection box includes the electronic component module 1, a frame to which the electronic component module 1 is assembled, and a lid member which is configured to cover a frame opening portion of the frame. The electrical connection box may be mounted on an end of a wire harness so as to be mounted on an automobile.

<Configuration of Electronic Component Module 1>

In FIGS. 1 to 4, the electronic component module 1 includes a substrate 5, a cover 6, and a connector block 7 (block member). The electronic component module 1 includes an engagement mechanism 8 (see FIG. 5) which is configured to engage the cover 6 and the connector block 7 and an engagement stabilization mechanism 9 which is configured to stabilize an engagement state of the engagement mechanism 8. The electronic component module 1 according to the present embodiment is connector-connected to a plurality of connectors (not illustrated), so that a "block member" described in claims is referred to as the "connector block 7".

<Substrate 5>

In FIG. 3, the substrate 5 includes a substrate body 10 which is a plate-shaped member having a rectangular shape in a plan view. A desired circuit (not illustrated) is formed on a back surface which is a lower surface of the substrate body 10. A large number of small through holes (not illustrated) are formed in the substrate body 10. A plurality of electronic components (for example, relays and resistors) are mounted on a surface side of the substrate body 10 by using the through holes. An electronic component is connected to the circuit by soldering on a back surface side. A plurality of pin terminals 11 are also provided on the front surface side of the substrate body 10. The pin terminals 11 are inserted into the through holes and connected to the circuit by soldering. The pin terminal 11 is formed in an L shape such that a proximal end side of the pin terminal 11 is disposed on a substrate front portion 12 of the substrate body 10 and the distal end side of the pin terminal 11 protrudes outward beyond an end portion 13 of the substrate front portion 12. The distal end side of the pin terminal 11 passes through the connector block 7 and is disposed such that connector connection can be performed at the connector block 7.

<Cover 6>

In FIGS. 1, 2, 3 and 6, the cover 6 is a resin molded product, and is formed in a bottomed cylindrical shape (box shape) including an opening portion 14 and an internal housing space S. Specifically, the cover 6 is formed in the bottomed cylindrical shape (box shape) including an opening portion 14 which opens in a substantially rectangular shape, four walls 15 which are configured to form the opening portion 14, four corner parts 16 which are formed in the opening portion 14, and a wall 17 at a position (a position of a ceiling in orientation of the present embodiment) corresponding to the bottom of the cover 6. The cover 6 is formed in the bottomed cylindrical shape (box shape) which can house and protect the substrate 5. The cover 6 is formed in the bottomed cylindrical shape (box shape) so as to engage the connector block 7 the opening portion 14 and to cover the connector block 7.

<Opening Portion 14>

In FIGS. 3 and 6, the opening portion 14 is formed to open in a substantially rectangular shape by the four walls 15 and the four corner parts 16. The opening portion 14 is formed to open in accordance with a shape of the connector block 7. A plurality of cover side lock portions 18, which are engagement mechanisms 8 on a cover 6 side, and a plurality of convex portions 30 to be described below, which are the engagement stabilization mechanisms 9 on the cover 6 side, are formed on an inner surface of the opening portion 14. The opening portion 14 is referred to as an "opening portion" including not only an opening edge but also a part of a range in which the connector block 7 is inserted.

<Four Walls 15>

In FIGS. 3 and 6, "four" of the four walls 15 is a total of four: two of a first wall 19 and a second wall 20 which are at a predetermined interval in the front-rear direction indicated by the arrow R, and two of a third wall 21 and a fourth wall 22 which are at a predetermined interval in the left-right direction indicated by the arrow Q. As can be seen from the drawings, the first wall 19 and the second wall 20 are larger than the third wall 21 and the fourth wall 22. The first wall 19 and the second wall 20 are formed in accordance with a size of the substrate 5 in the plan view. On the other hand, the third wall 21 and the fourth wall 22 are formed in elongated rectangular walls. The third wall 21 and the fourth wall 22 are formed in accordance with a size of the substrate 5 in a front-back direction. The four walls 15 are formed such that the four corner parts 16 (to be described below) are respectively interposed between the walls on the opening portion 14 side. The walls are continuous on a side which is not the opening portion 14 side.

<Bracket Attachment and Detachment Portion 23>

In FIGS. 1 to 3, the first wall 19 of the four walls 15 is integrally formed with a bracket attachment and detachment portion 23 which is detachably attached to the bracket 4 provided in an automobile. The disposing and the shape of the bracket attachment and detachment portion 23 illustrated in the drawings is an example.

<Four Corner Parts 16>

In FIGS. 2, 3 and 6, the four corner parts 16 are disposed and formed in continuous parts of the four walls 15 in the opening portion 14. The four corner parts 16 are formed in tapered parts facing four corner portions (see FIG. 10), which will be described below, of the connector block 7. The four corner parts 16 are sufficiently short in length as compared with the four walls 15.

<Cover Side Lock Portion 18>

In FIGS. 4 to 7, the cover side lock portion 18 is an engagement mechanism 8 formed on the cover 6 side as described above. In the opening portion 14, one cover side lock portion 18 is formed on the first wall 19 and two cover side lock portions 18 are formed on the second wall 20 (the disposing and the number of the cover side lock portions 18 are one example). The cover side lock portion 18 is formed in a substantially claw-shaped convex portion protruding inward from inner surfaces of the first wall 19 and the second wall 20. The cover side lock portion 18 is formed with a curved (or tapered) guide surface 24 and a locking surface 25 which is hooked by a block side lock portion 49 to be described below. When the cover side lock portion 18 is caught on the block side lock portion 49, an engagement state is formed as illustrated in FIG. 5. This engagement state is kept stable by the engagement stabilization mechanism 9 which is a feature of the present invention.

<Configuration of Engagement Stabilization Mechanism 9>

In FIG. 4, the engagement stabilization mechanism 9 includes two mechanisms which are a first stabilization mechanism 26 and a second stabilizing mechanism 27. The engagement stabilization mechanism 9 according to the present embodiment is formed such that the first stabilization mechanism 26 is integrated with the second stabilization mechanism 27. In other words, the first stabilization mechanism 26 is integrated into the second stabilization mechanism 27 (it is an example. For example, it may be formed in a state of a second embodiment to be described below). The first stabilization mechanism 26 is configured to be divided into a part on the cover 6 side and a part on a connector block 7 side. Similarly, the second stabilization mechanism 27 is configured to be divided into a part on the cover 6 side and a part on the connector block 7 side. A reference numeral 28 in FIG. 4 denotes an engagement stabilization mechanism in which the first stabilization mechanism 26 is integrated with the second stabilization mechanism 29. The engagement stabilization mechanism 28 has basically the same function as the engagement stabilization mechanism 9.

<Part of Second Stabilization Mechanism 27 on Cover 6 Side>

In FIGS. 4, 6, and 8, the part of the second stabilization mechanism 27 on the cover 6 side corresponds to a pair of convex portions denoted by a reference numeral 30. The pair of convex portions 30 are disposed and formed on a wall inner surface 31 of the first wall 19 in the opening portion 14. The pair of convex portions 30 are also disposed and formed at predetermined intervals on both sides of the cover side lock portion 18 disposed on the wall inner surface 31 of the first wall 19. The pair of (two) convex portions 30 have the same shape. Therefore, one of the convex portions 30 will be described below.

<Convex Portion 30>

In FIG. 8, the convex portion 30 includes a pair of second longitudinal ribs 32, a pair of second lateral ribs 33, and a back portion 34, and is formed in an illustrated shape. The pair of second longitudinal ribs 32 is a longitudinal rib-shaped portion which is orthogonal to the wall inner surface 31 of the first wall 19 and extends short and straight downward. The pair of second longitudinal ribs 32 are inserted into concave portions 53 (see FIG. 13) to be described below. The pair of second longitudinal ribs 32 are disposed in alignment with both end positions of a first lateral rib 63 (see FIG. 13), which will be described below, of the concave portions 53. On the other hand, the pair of second lateral ribs 33 are formed continuous with lower ends of the pair of second longitudinal ribs 32 respectively. The pair of second lateral ribs 33 is formed as lateral rib-shaped portions parallel to the wall inner surface 31 of the first wall 19. The pair of second lateral ribs 33 is inserted between the first lateral rib 63 and a concave bottom surface 57 (see FIG. 13) to be described later. The pair of second longitudinal ribs 32 and the pair of second lateral ribs 33 forming the convex portion 30 are a pair of L-shaped ribs 35 which have a substantial L shape in cross section and face each other. The back portion 34 is formed so as to give rigidity to the pair of L-shaped ribs 35 (to make it difficult to open the facing L-shaped ribs 35).

A reference numeral 36 in the convex portion 30 denotes a slit between the pair of second lateral ribs 33. A reference numeral 37 denotes a guide slope. The guide slope 37 is formed as a guide surface for a pair of first backlash preventing ribs 64 (see FIG. 13) to be described below. A reference numeral 38 in the convex portion 30 denotes a cover side inclined surface. The cover side inclined surface 38 is formed as a part of the first stabilization mechanism 26 on the cover 6 side.

<Part of Second Stabilization Mechanism 29 on Cover 6 Side>

In FIG. 6, the part of the second stabilization mechanism 29 on the cover 6 side forms the engagement stabilization mechanism 28 (see FIG. 4). The part of the second stabilization mechanism 29 on the cover 6 side is formed as a convex portion 69. The convex portion 69 is disposed and formed on the wall inner surface 31 of the second wall 20 in the opening portion 14. The convex portion 69 is disposed and formed between the pair of cover side lock portions 18 disposed on the wall inner surface 31 of the second wall 20. The convex portion 69 includes a pair of second longitudinal ribs, a pair of second lateral ribs, and a back portion, which are not particularly designated by reference numerals, and is formed in an illustrated shape.

<Part of First Stabilization Mechanism 26 on Cover 6 Side>

In FIG. 8, the part of the first stabilization mechanism 26 on the cover 6 side is the cover side inclined surface 38 disposed in the convex portion 30 in the present embodiment. The cover side inclined surface 38 is configured to receive a "force to push back" from the part of the first stabilization mechanism 26 on the connector block 7 side (a block side inclined surface 67 (see FIG. 15) to be described below).

<Connector Block 7 (Block Member)>

In FIGS. 2, 3, 4, 9, 10 and 11, the connector block 7 is assembled to a substrate front portion 12 of the substrate 5 and is formed so as to perform connector connection in the electronic component module 1. The connector block 7 includes a block body 39 which is a resin molded product. The connector block 7 is formed to function as a connector by the distal end side of the pin terminal 11 of the substrate 5 passing through the block body 39. The connector block 7 includes the block body 39 and (the distal end side) of the pin terminal 11.

<Block Body 39>

In FIGS. 2, 3, 4, 9, 10 and 11, three types of connector connection portions 40 to 42 are formed in the block body 39. The connector connection portions 40 to 42 are configured to enable connector connection to a connector (not illustrated) of the wire harness 2 (see FIG. 1) and are formed in a cavity shape. The distal end side of the pin terminal 11 protrudes into each of the connector connection portions 40 to 42.

A side portion of the block body 39 is formed in an illustrated shape including four side portions 43 and four corner portions 44. The side portion of the block body 39 is formed in accordance with a shape of the opening portion 14 of the cover 6. The block body 39 is formed in a block-shaped member which is less likely to be bent than the cover 6.

<Four Side Portions 43>

Figure 9A:
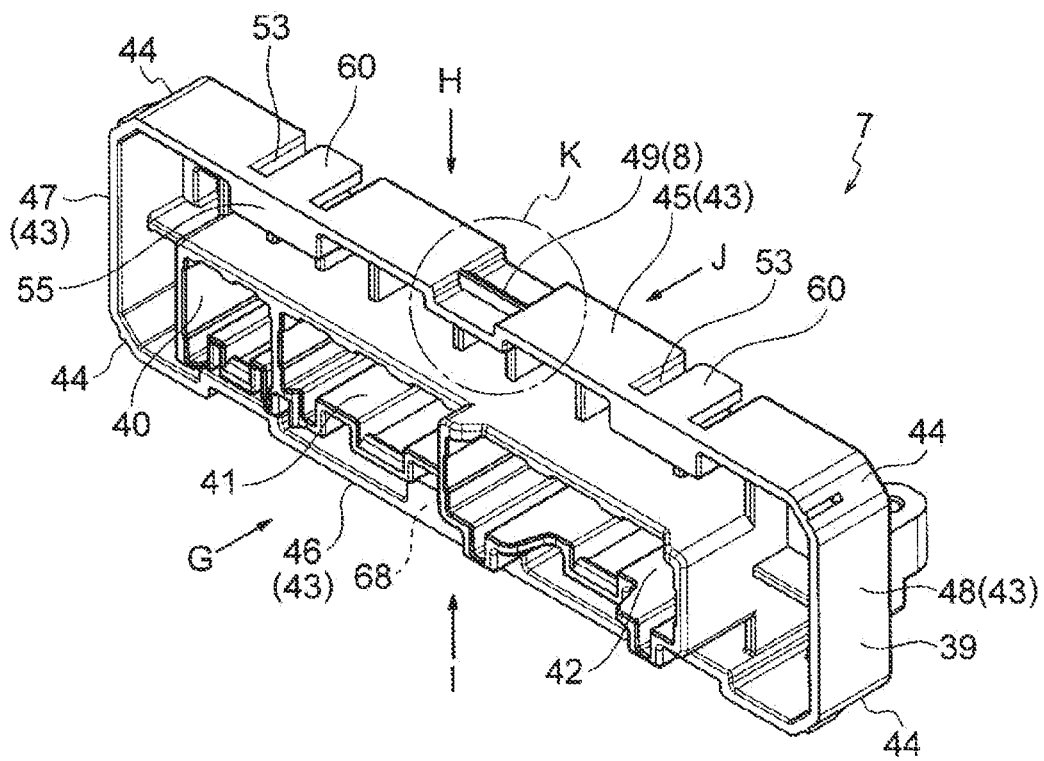
Figure 9B:
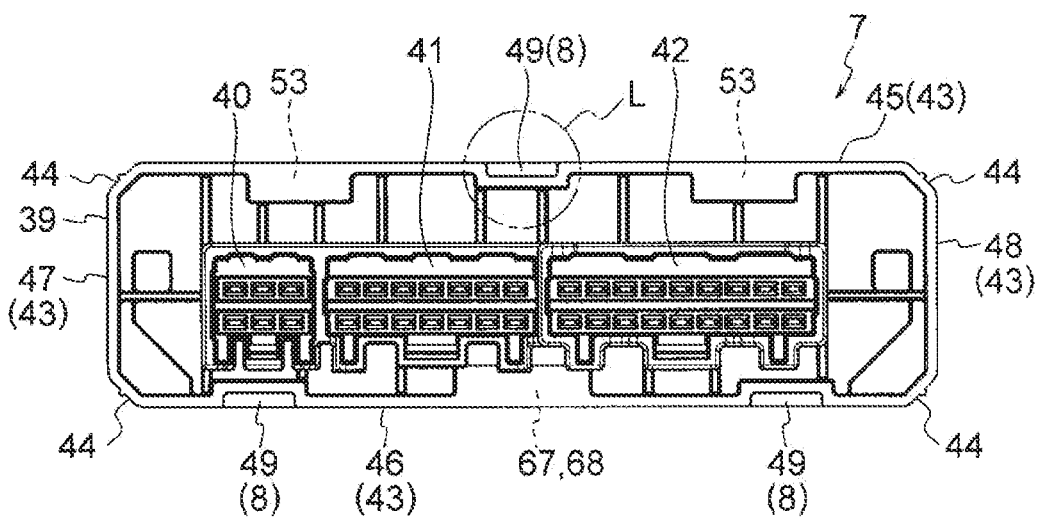
Figure 11A:
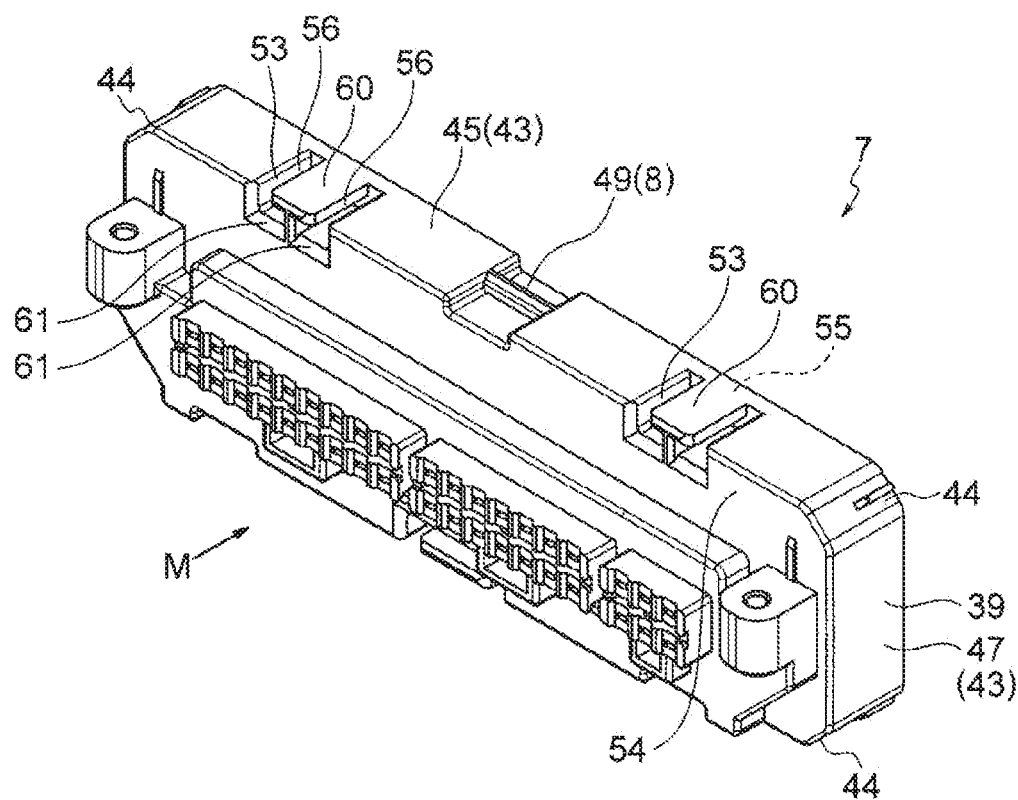
Figure 11B:
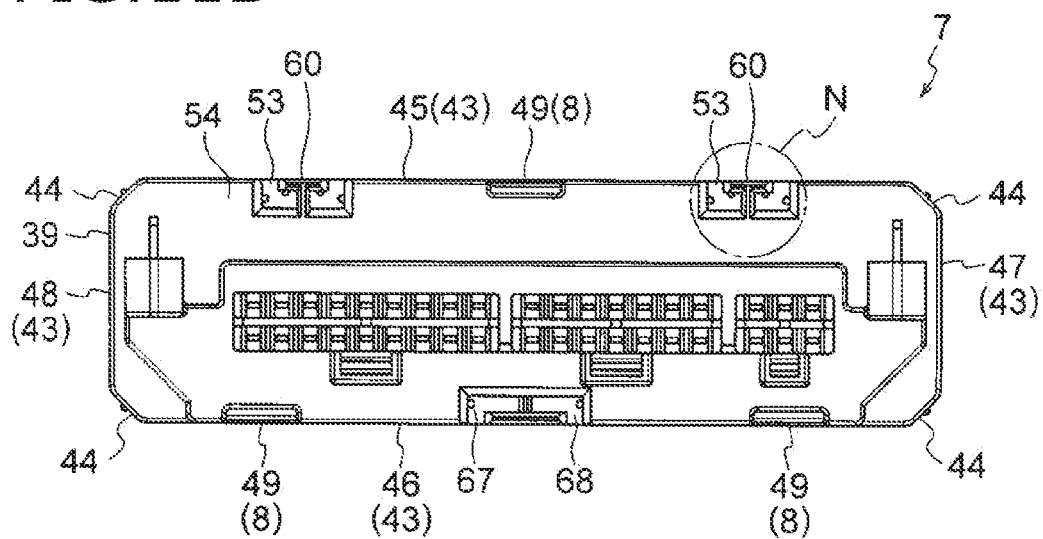

In FIGS. 9 to 11, the four side portions 43 includes a first side portion 45 and a second side portion 46 which face the first wall 19 and the second wall 20 in the opening portion 14 of the cover 6, and a third side portion 47 and a fourth side portion 48 which face the third wall 21 and the fourth wall 22 in the opening portion 14. A plurality of block side lock portions 49 are a part of the engagement mechanism 8 (see FIG. 4) on the connector block 7 side and are formed on the first side portion 45 and the second side portion 46. A part of the engagement stabilization mechanism 9 (see FIG. 4) on the connector block 7 side and a part of the engagement stabilization mechanism 28 (see FIG. 4) on the connector block 7 side are formed on the first side portion 45 and the second side portion 46, respectively.

The part of the engagement stabilization mechanism 9 (see FIG. 4) on the connector block 7 side is a part of the second stabilization mechanism 27 and the first stabilization mechanism 26 on the connector block 7 side. The part of the engagement stabilization mechanism 28 (see FIG. 4) on the connector block 7 side is a part of the first stabilization mechanism 26 and the second stabilization mechanism 29 on the connector block 7 side.

<Block Side Lock Portion 49>

In FIGS. 5, 9, 10, 11 and 12, the block side lock portion 49 is the engagement mechanism 8 formed on the connector block 7 side as described above. The block side lock portion 49 is engaged with the cover side lock portion 18 in the opening portion 14 of the cover 6 and is disposed and formed in accordance with a position of the cover side lock portion 18. The block side lock portion 49 is formed in a substantially claw-shaped convex portion protruding outward from a bottom 50 of a part where outer surfaces of the first side portion 45 and the second side portion 46 are lowered. The block side lock portion 49 is formed with a tapered guide surface 51 and a locking surface 52 which is hooked by the cover side lock portion 18.

<Four Corner Portions 44>

In FIGS. 9 to 11, the four corner portions 44 are formed in a shape facing the four corner parts 16 (see FIG. 6) of the opening portion 14 of the cover 6.

<Part of Second Stabilization Mechanism 27 on Connector Block 7 Side>

In FIGS. 9 to 11, the part of the second stabilization mechanism 27 on the connector block 7 side corresponds to a pair of concave portions denoted by a reference numeral 53. The pair of concave portions 53 are disposed and formed on the first side portion 45. The pair of concave portions 53 are formed in accordance with positions of the pair of convex portions 30 (see FIG. 6) of the cover 6. The pair of (two) concave portions 53 have the same shape. Therefore, one of the concave portions 53 will be described below.

<Concave Portion 53>

In FIGS. 11 and 13, the concave portion 53 is a recessed part so that the first side portion 45 is recessed. The concave portion 53 is a recessed part in which the rear surface 54 of the block body 39 is opened as well as the front surface 55 of the block body 39 is not opened. The concave portion 53 includes a pair of concave openings 56 (which are a pair since a T-shaped rib 60 to be described below is formed) which is an opening surface flush with an outer surface of the first side portion 45, a concave bottom surface 57 which is a bottom part, a pair of concave side surfaces 58, a concave back surface 59 which is a back side as viewed from convex portion insertion openings 61 to be described below, the T-shaped rib 60, and a pair of convex portion insertion openings 61, and is formed in an illustrated shape. The concave portion 53 is formed such that the pair of L-shaped ribs 35 of the convex portion 30 slides by being guided by the T-shaped rib 60 when the convex portion 30 of the cover 6 is inserted through the pair of convex portion insertion openings 61.

<T-Shaped Rib 60>

In FIG. 13, the T-shaped rib 60 includes a first longitudinal rib 62 protruding from a center of the concave bottom surface 57 of the concave portion 53 toward a side where the pair of concave openings 56 are provided and a first lateral rib 63 continuous with the first longitudinal rib 62 at a position of the pair of concave openings 56, and is formed in a substantial T shape in cross section. The T-shaped rib 60 is formed so as to extend straight from the pair of convex portion insertion openings 61 to the concave back surface 59. The T-shaped rib 60 is integrated with the concave back surface 59 and has sufficient rigidity.

In FIGS. 13 and 14, the pair of first backlash preventing ribs 64 are formed on the first lateral rib 63 of the T-shaped rib 60. The pair of first backlash preventing ribs 64 are formed in a vicinity of both ends of the first lateral rib 63. The pair of first backlash preventing ribs 64 are disposed and formed on the back side as viewed from the convex portion insertion opening 61 (the disposing is on the back side for formation of the engagement state by the engagement mechanism 8 in FIG. 5). The pair of first backlash preventing ribs 64 include a guide inclined surface 65 at an end portion on a convex portion insertion opening 61 side, and is formed so as to extend straight in a substantially semi-cylindrical shape in cross section up to the concave back face 59. The pair of first backlash preventing ribs 64 is formed to press-fit the pair of L-shaped ribs 35 of the convex portion 30. Rattling can be eliminated by press-fitting. Therefore, it is of course possible to provide a noise preventing effect in addition to effects to be described below.

The pair of first backlash preventing ribs 64 are formed to cause an outer surface of the first side portion 45 of the connector block 7 and the wall inner surface 31 of the first wall 19 of the cover 6 to approach each other. When opening occurs so that the pair of L-shaped ribs 35 facing each other are separated, a clearance between the outer surface of the first side portion 45 and the wall inner surface 31 of the first wall 19 may be slightly increased. However, the increasing (the opening) is prevented by a pair of second backlash preventing ribs 66 disposed and formed on the pair of concave side surfaces 58. The pair of second backlash preventing ribs 66 is configured to restrict the pair of L-shaped ribs 35 from being deformed in a separation direction.

As the outer surface of the first side portion 45 and the wall inner surface 31 of the first wall 19 approach each other, disengagement does not occur in the engagement mechanism 8 in FIG. 5. Therefore, it is understood that the structure (the engagement structure between the cover 6 and the connector block 7) can stabilize the engagement state by the engagement mechanism 8.

From a structure of the pair of L-shaped rib 35 and T-shaped rib 60, even if the wall inner surface 31 of the first wall 19 is separated from the outer surface of the first side portion 45 (even if the cover 6 is opened), the T-shaped rib 60 can restrict a movement of the pair of L-shaped ribs 35. Therefore, disengagement does not occur in the engagement mechanism 8 in FIG. 5. Therefore, it is understood that the structure (the engagement structure between the cover 6 and the connector block 7) can stabilize the engagement state by the engagement mechanism 8.

<Part of First Stabilization Mechanism 26 on Connector Block 7 Side>

In FIGS. 13 to 15, the part of the first stabilization mechanism 26 on the connector block 7 side corresponds to the pair of second backlash preventing ribs 66 (a block side inclined surface 67 to be described below). The pair of second backlash preventing ribs 66 is configured to apply "force to push back" to the cover side inclined surface 38 of the pair of L-shaped ribs 35. The pair of second backlash preventing ribs 66 each have the block side inclined surface 67 so as to apply the "force to push back". The block side inclined surface 67 is formed in an inclined surface shape (see FIG. 15) on which the cover side inclined surface 38 slides.

When the pair of L-shaped ribs 35 are pushed back by the pair of second backlash preventing ribs 66, in the engagement mechanism 8 in FIG. 5, surfaces of the locking surface 25 of the cover side lock portion 18 and the locking surface 52 of the block side lock portion 49 contact each other (or face each other with a minute gap), so that there is no engagement backlash. Therefore, it is understood that the structure (the engagement structure between the cover 6 and the connector block 7) can stabilize the engagement state by the engagement mechanism 8.

<Part of Second Stabilization Mechanism 29 and First Stabilization Mechanism 26 on Connector Block 7 Side>

In FIG. 11, the part of the second stabilization mechanism 29 on the connector block 7 side forms the engagement stabilization mechanism 28 (see FIG. 4) and corresponds to a concave portion denoted by a reference numeral 68. The concave portion 68 is disposed and formed in accordance with the convex portion 69 (see FIG. 6) on a mating side. The concave portion 68 includes a pair of concave openings, a concave bottom surface, a pair of concave side surfaces, a concave back surface, a T-shaped rib, and a pair of convex portion insertion openings, which are not particularly designated by reference numerals, and is formed in an illustrated shape. The concave portion 68 includes the pair of second backlash preventing ribs 66 and is formed in the illustrated shape. The pair of second backlash preventing ribs 66 includes the block side inclined surface 67 and forms the first stabilization mechanism 26.

<Engagement Structure of Cover 6 and Connector Block 7>

As described above with reference to FIGS. 1 to 15, the "engagement structure of the cover 6 and the connector block 7" according to an embodiment of the present invention includes the first stabilization mechanism 26 and the second stabilization mechanism 27 together with the engagement mechanism 8 which is configured to engage the cover 6 and the connector block 7. Therefore, it is possible to prevent backlash in the engagement mechanism 8 and restrict the opening between the wall inner surface 31 of the first wall 19 of the cover 6 and the outer surface of the first side portion 45 of the connector block 7 to prevent the engagement mechanism 8 from being disengaged by the first stabilization mechanism 26 and the second stabilization mechanism 27. That is, there is an effect that the engagement state by the engagement mechanism 8 can be stabilized.

The "engagement structure of the cover 6 and the connector block 7" according to an embodiment of the present invention includes the first stabilization mechanism 26 and the second stabilization mechanism 29 together with the engagement mechanism 8. Therefore, it is possible to prevent backlash in the engagement mechanism 8 and restrict the opening between the wall inner surface 31 of the second wall 20 of the cover 6 and the outer surface of the second side portion 46 of the connector block 7 to prevent a pair of engagement mechanisms 8 from being disengaged by the first stabilization mechanism 26 and the second stabilization mechanism 29. That is, there is an effect that the engagement state of the pair of engagement mechanisms 8 can be stabilized.

It is possible to provide better electronic component module 1, electrical connection box (not illustrated), and wire harness 2 by using the structure having the above effects, that is, the "engagement structure of the cover 6 and the connector block 7".

Second Embodiment

Figure 16A:
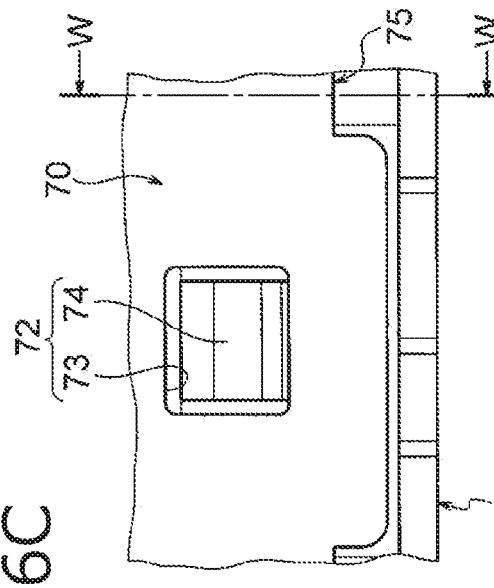
Figure 16C:
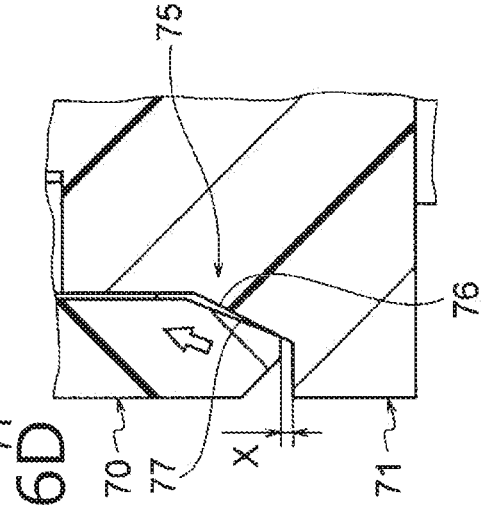
Figure 16B:
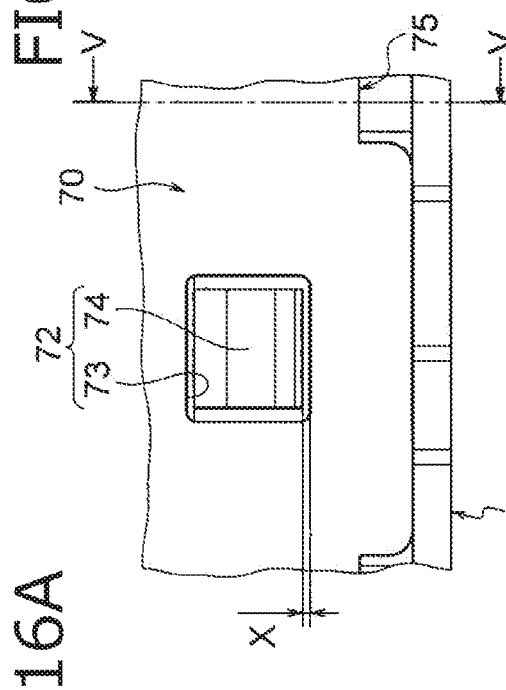
FIG. 16B is a cross-sectional view taken along a line V-V in FIG. 16A.
Figure 16D:
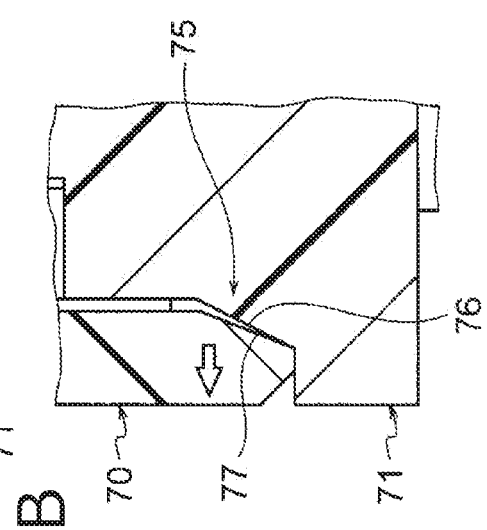

A second embodiment will be described below with reference to the drawings. FIGS. 16A, 16B, 16C, and 16D illustrate a modification of the first stabilization mechanism, in which FIG. 16A illustrates excessive insertion due to backlash that occurs in the engagement mechanism, FIG. 16B is a cross-sectional view taken along a line V-V in FIG. 16A, FIG. 16C illustrates a backlash preventing condition, and FIG. 16D is a cross-sectional view taken along a line W-W in FIG. 16C.

<Engagement Structure of Cover 70 and Connector Block 71>

In FIG. 16A, the connector block 71 is inserted into and engaged with the opening portion of the cover 70. In the engagement mechanism 72, a rectangular hole-shaped cover side lock portion 73 formed in the cover 70 and a convex block side lock portion 74 formed in the connector block 71 are engaged. When the hole-shaped cover side lock portion 73 and the convex block side lock portion 74 are engaged, excessive insertion (over-stroke) is generally required. This excessive insertion causes an engagement backlash indicated by a dimension X. The engagement backlash may affect the engagement state by the engagement mechanism 72. Therefore, in the second embodiment, the first stabilization mechanism 75 different from that in the first embodiment is provided to stabilize the engagement state by the engagement mechanism 72.

<First Stabilization Mechanism 75>

In FIG. 16B, a cover side inclined surface 76 having an inclined surface shape is formed at an end portion of the cover 70. A block side inclined surface 77 having an inclined surface shape is also formed on the connector block 71. The cover side inclined surface 76 slides on the block side inclined surface 77 in an insertion direction. When the connector block 71 is inserted into the opening portion of the cover 70 and excessive insertion (over-stroke) is performed at this time, the end portion of the cover 70 is slightly lifted due to the sliding. Then, when the cover side lock portion 73 and the block side lock portion 74 are engaged, the slightly lifted end portion of the cover 70 would return to an original state as illustrated in FIGS. 16C and 16D. At this time, the cover side inclined surface 76 slides in an opposite direction of the insertion direction (the cover side inclined surface 76 is pushed back by the block side inclined surface 77). Therefore, the engagement backlash is absorbed. Therefore, the engagement state by the engagement mechanism 72 can be stabilized.

As described above with reference to FIGS. 16A to 16D, the first stabilization mechanism 75 according to the second embodiment is also effective as that according to the first embodiment.

It goes without saying that the present invention can be variously modified without departing from the gist of the present invention.

What is claimed is:
1. An engagement structure of a cover and a block member, the engagement structure comprising:
a cover having a bottomed cylindrical shape and which includes a substantially rectangular opening portion;
a block member configured to be inserted into the opening portion of the cover;
an engagement mechanism configured to engage the block member with the opening portion; and
an engagement stabilization mechanism configured to stabilize an engagement state of the engagement mechanism,
wherein the engagement stabilization mechanism includes a first stabilization mechanism and a second stabilization mechanism,
wherein the first stabilization mechanism is configured to permit excessive insertion due to backlash that occurs in the engagement mechanism when the block member is inserted into the opening portion and to restore the excessive insertion after the block member is engaged with the opening portion by the engagement mechanism, and wherein the second stabilization mechanism is configured to perform a slide engagement between the block member and the opening portion when the block member is inserted into the opening portion and to restrict a wall inner surface of the cover from moving away from an outer surface of a side portion of the block member after the slide engagement s completed.

2. The engagement structure according to claim 1, wherein the second stabilization mechanism includes:
   a concave portion provided on one of the outer surface of the side portion of the block member and the wall inner surface of the cover, and
   a convex portion provided on the other of the outer surface of the side portion of the block member and the wall inner surface of the cover,
wherein a T-shaped rib having a substantial T shape in cross section and a convex portion insertion opening which is an insertion part for the convex portion are formed in the concave portion, the T-shaped rib having a first longitudinal rib protruding toward a concave opening from substantially a center of a concave bottom surface of the concave portion and a first lateral rib being continuous with the first longitudinal rib at the concave opening,
wherein the convex portion has a pair of L-shaped ribs which have a substantial L shape in cross section and include a pair of second longitudinal ribs and a pair of second lateral ribs, and
wherein the pair of second longitudinal ribs are inserted into the concave portion via the convex portion insertion opening at both end positions of the first lateral rib in the concave opening and the pair of second lateral ribs are respectively continuous with the pair of second longitudinal ribs so as to be inserted between the concave bottom surface and the first lateral rib.

3. The engagement structure according to claim 2, wherein a pair of first backlash preventing ribs are provided on the concave portion and act in a direction in which the outer surface of the side portion of the block member and the wall inner surface of the cover move closer to each other, and the pair of first backlash preventing ribs are disposed at a position where the pair of second lateral ribs in the convex portion are in contact with the pair of first backlash preventing ribs.

4. The engagement structure according to claim 2, wherein a pair of second backlash preventing ribs are provided on a concave side surface of the concave portion, and the pair of second backlash preventing ribs are formed in a shape that restricts the pair of L-shaped ribs, which are the convex portion, from being deformed in a separation direction.

5. The engagement structure according to claim 4, wherein the pair of second backlash preventing ribs serve as the first stabilization mechanism.

6. The engagement structure according to claim 1, wherein the second stabilization mechanism is disposed at both sides of the engagement mechanism and/or disposed between the engagement mechanism and other engagement mechanism.

7. The engagement structure according to claim 1, the first stabilization mechanism includes a cover side inclined surface formed on an edge inner surface of the opening and a block side inclined surface of the block member formed in a shape on which the cover side inclined surface slides.

8. An electronic component module, comprising:
a substrate on which a plurality of electronic components are mounted;
a cover having a bottomed cylindrical shape and has an opening portion;
a block member configured to be inserted into the opening portion of the cover in a state that the substrate is held by the block member;
an engagement mechanism configured to engage the block member with the opening portion; and
an engagement stabilization mechanism configured to stabilize an engagement state of the engagement mechanism,
wherein the engagement structure according to claim 1 is provided on the cover and the block member.

9. An electrical connection box, comprising:
the electronic component module according to claim 8;
a frame to which the electronic component module is configured to be assembled; and
a lid member configured to cover a frame opening portion of the frame.

10. A wire harness, comprising:
a wire harness body; and
the electric connection box according to claim 9 provided at an end portion of the wire harness body,
wherein the wire harness body is wired in an automobile.

11. A wire harness, comprising:
a wire harness body; and
the electronic component module according to claim 8 provided at an end portion of the wire harness body,
wherein the wire harness body is wired in an automobile.

12. The wire harness according to claim 11, wherein a cover of the electronic component module is formed with a bracket attaching and detaching portion which is attachable to and detachable from a bracket provided in the automobile.

* * * * *